United States Patent [19]
Kondo

[11] Patent Number: 5,420,048
[45] Date of Patent: May 30, 1995

[54] MANUFACTURING METHOD FOR SOI-TYPE THIN FILM TRANSISTOR

[75] Inventor: Shigeki Kondo, Hiratsuka, Japan

[73] Assignee: Canon Kabushiki Kaisha, Tokyo, Japan

[21] Appl. No.: 815,021

[22] Filed: Dec. 31, 1991

[30] Foreign Application Priority Data

Jan. 9, 1991 [JP] Japan .................................. 3-011623
Jan. 9, 1991 [JP] Japan .................................. 3-011642

[51] Int. Cl.⁶ .......................................... H01L 21/265
[52] U.S. Cl. .............................. 437/21; 437/40; 437/41; 148/DIG. 77; 148/DIG. 150; 257/66; 257/67
[58] Field of Search ............... 437/21, 40, 41; 257/60, 257/61, 347, 66, 67, 68, 69; 148/DIG. 77, 150

[56] References Cited

U.S. PATENT DOCUMENTS

| | | | |
|---|---|---|---|
| 4,263,709 | 4/1981 | Weitzel et al. | 437/21 |
| 4,720,736 | 1/1988 | Takafuji et al. | 257/60 |
| 4,727,044 | 2/1988 | Yamazaki | 437/45 |
| 4,788,157 | 11/1988 | Nakamura | 437/46 |
| 4,951,113 | 8/1990 | Huang et al. | 257/61 |
| 4,954,855 | 9/1990 | Mimura et al. | 257/61 |
| 5,032,883 | 7/1991 | Wakai et al. | 257/61 |
| 5,202,572 | 4/1993 | Kobayashi | 257/60 |

FOREIGN PATENT DOCUMENTS 0304824  3/1989  European Pat. Off. .
63-107016  5/1988  Japan .

OTHER PUBLICATIONS

Extended Abstracts, 22nd Conf. Solid State Devices & Materials, Aug. 22-24, 1990, pp. 1195-1196, Ueda et al. "A 5 non thick ultra-thin double-gated poly Si TFT using Si2H6 as a source gas".
Pat. Abs. Jp. vol. 15, No. 78, Feb. 22, 1991.
Pat. Abs. Jp. vol. 9, No. 225, Sep. 11, 1985.
Olin Hunt, "Waycoat HPR 200" Positive Working Resists, 5 Garret Mountain Plaza, West Paterson, N.J. 07424, pp. 1-13, [date unknown].

Primary Examiner—Olik Chaudhuri
Assistant Examiner—Long Pham
Attorney, Agent, or Firm—Fitzpatrick, Cella, Harper & Scinto

[57] ABSTRACT

An SOI-type thin film transistor having a transparent insulating substrate, a first gate electrode, a first gate insulating film, a semiconductor layer, a second gate electrode and a second gate insulating film which are respectively formed on the transparent insulating substrate, wherein the width of the first gate electrode and that of the second gate electrode are different from each other and as well as the thickness of the first gate insulating film and that of the second gate insulating film are different from each other.

10 Claims, 3 Drawing Sheets

MANUFACTURING METHOD FOR SOI-TYPE THIN FILM TRANSISTOR

BACKGROUND OF THE INVENTION

1. Field of the Invention

The present invention relates to a high performance thin film transistor having an SOI structure and a manufacturing method therefor.

2. Related Background Art

Recently, a thin film transistor has been attracting attention as an element which constitutes a three-dimensional integrated circuit, a contact sensor or a plane display device. In particular, a study has been made in order to improve the performance of a silicon thin film transistor by approximating its crystallinity to that of the monocrystal substance. Another study has been made in order to significantly improve the mobility by utilizing the specific mechanism in such a manner that the thickness of the thin film is considerably reduced (0.1 $\mu$m or less). However, although each specific characteristic has attracted attention according to the above-described studies, the relative changes between the other transistor characteristics have not been sufficiently detected.

The inventor of the present invention has studied the overall electrical characteristics of the thin film transistor having the SOI structure, resulting in a knowledge to be found from simulations that, if the thickness of the semiconductor layer becomes thinner than a predetermined thickness, the drain voltage resistance at the time when the gate voltage is 0V (when it is turned off) rapidly deteriorates in comparison to that displayed by a thick film semiconductor layer. Another fact was found from simulations that, although the avalanche breakdown, which determines the drain voltage resistance and which takes place at the drain end, arises in the vicinity of the gate interface in the case of a thick semiconductor, the same arises in the vicinity of an interface with the base insulating substrate in the case where the thickness is smaller than the predetermined thickness.

More particularly, the conventional simulation made about an SOI-type MIS-FET, which was constituted by forming, on a thick insulating substrate, a thin film semiconductor layer, a gate insulating film and a gate electrode, found a fact that the maximum electric fields were concentrated in a vicinity of the gate interface and the avalanche breakdown was first taken place in the vicinity of the gate interface in such a manner that the above-described tendency was maintained regardless of the thickness of the semiconductor layer.

The inventor has made simulations while taking into consideration the fixed charge (Qss) at the interface between the base insulating substrate and the semiconductor layer which was considered to be present in an actual SOI structure. As a result, a fact was found that, although the electric field was strong on the gate interface side in comparison to that at the portion adjacent to the base interface, the avalanche breakdown actually took place in the vicinity of the base interface. Although the detailed mechanism is being researched now, it can be considered that the avalanche breakdown depends upon not only the electric field but also the number of carriers and thereby the number of the carriers is further affected at the base interface while an assumption is made that the equivalent Qss is applied to the gate and the portion adjacent to the base interface.

SUMMARY OF THE INVENTION

An object of the present invention is to provide a thin film transistor having an SOI structure in which the deterioration in the drain voltage resistance at the time of the stop of the operation can be prevented while maintaining excellent characteristics such as the high mobility and a low incidental capacity realized due to the arrangement in which the thickness is reduced.

Other and further objects, features and advantages of the invention will be appear more fully from the following description.

DETAILED DESCRIPTION OF THE PREFERRED EMBODIMENTS

A preferred embodiment of an SOI-type thin film transistor according to the present invention will now be described. According to the present invention, there is provided an SOI-type thin film transistor composed of a first gate electrode, a first gate insulating film, a semiconductor layer, a second gate electrode and a second gate insulating film each of which is formed on a transparent insulating substrate, the SOI-type thin film transistor comprising an improvement arranged in such a manner that the width of the first gate electrode and that of the second gate electrode are different from each other and as well as the thickness of the first gate insulating film and that of the second gate insulating film are different from each other.

A preferred embodiment of a method of manufacturing the SOI-type thin film transistor according to the present invention will now be described.

The method of manufacturing an SOI-type thin film transistor comprises a process in which a first electrode is formed on a transparent insulating substrate, a first insulating film is formed on the first electrode and a semiconductor layer is formed on the first insulating film and a process in which an impurity diffusion layer of a transistor is formed, wherein the impurity diffusion layer is formed by backside exposure carried out from the transparent insulating substrate while using the first electrode as an exposure mask and a pattern, the size of which is larger than that of the first electrode used as the exposure mask, is used as an ion injection mask.

Since the SOI-type thin film transistor according to the present invention enables the incidental capacitance between the gate and the drain to be further reduced and thereby enables the operational speed to be raised, the drain rupture voltage resistance at the time when the transistor is turned off can be enlarged. Furthermore, since the two gate electrodes, which are vertically disposed, and the source and drain regions are formed in a self-alignment manner, the undesirable dispersion of characteristics can be prevented and thereby the yield can be improved.

The present invention will now be described in detail with reference to the drawings.

Figure 1A:
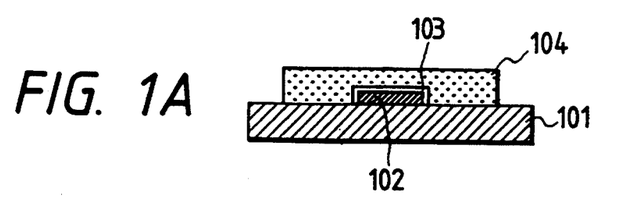
FIGS. 1A to 1F are schematic views which illustrate an example of a process of manufacturing a thin film transistor according to the present invention.
Figure 1B:
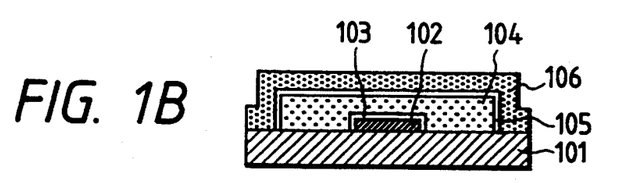
Figure 1C:
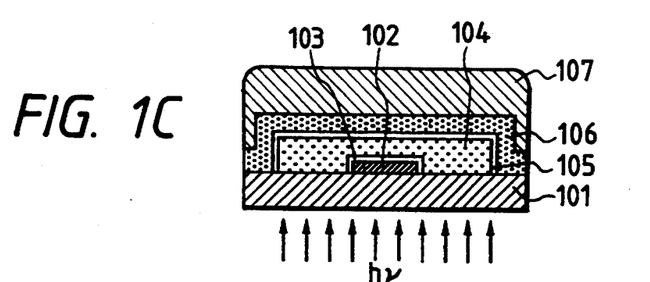
Figure 1D:
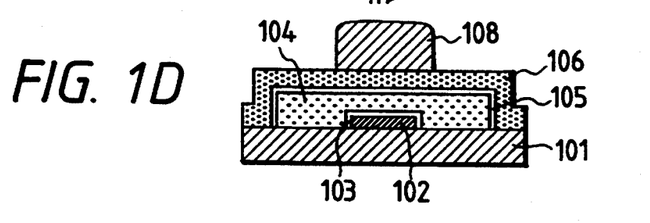
Figure 1E:
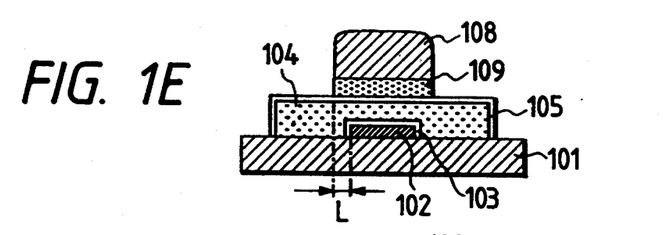
Figure 1F:
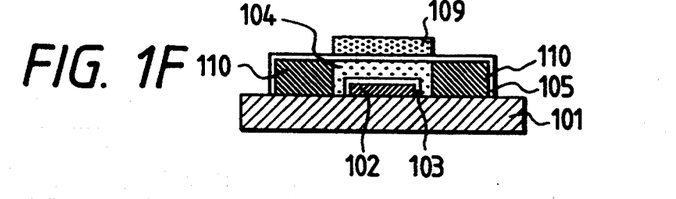

FIG. 1F is a schematic view which illustrates an example of the cross sectional structure of the SOI-type thin film transistor according to the present invention.

The thin film transistor according to the present invention is an MIS-FET formed into a so-called double gate structure. The joining surface of the source and the drain region 110 is arranged in such a manner that the interface with a second gate insulating film 105 is placed at the end portion of the second gate electrode 109 disposed above the source and drain region 110. According to an example shown in FIG. 1, the interface with the first gate insulating film 103 is placed outside the first gate electrode 102 disposed below the source and drain region 110. As a result, a so-called offset gate structure is formed with respect to the first gate electrode 102 disposed below the source and drain region 110. Although the example show in FIG. 1 is arranged in such a manner that the width of the first gate electrode is narrower than that of the second gate electrode, the present invention is not limited to this. It is necessary for the width of the first gate electrode and that of the second electrode to be different from each other.

The transistor according to the present invention is arranged in such a manner that, when the vertically (when viewed in the drawings) disposed gate electrodes 102 and 109 are driven at the same potential, the channel is mainly controlled at the interface between the semiconductor layer 104 and the first gate insulating film when the transistor is turned on because the second gate insulating film 105 is thicker than the first gate insulating film 103. Therefore, the apparent mutual inductance $g_m$ is not substantially changed with respect to a sole gate or the same increases by a small quantity which corresponds to the contribution made by the second gate electrode 109. That is, the first gate electrode 102 acts as the main gate. In this case, since the second gate insulating film 105 is thick, its gate film capacity is too small to warp the electric field applied to the channel by the first gate electrode. Therefore, the characteristics (high carrier mobility) obtainable in a case where the thickness of the SOI layer is reduced can be maintained.

Furthermore, since the first gate electrode 102 is formed into the offset structure, the incidental capacity between the gate and the drain can further be reduced. Therefore, the operational frequency can be raised in comparison to a case where no offset is made.

On the other hand, when the transistor is not operated, the electric field on the interface between the drain joining surface and the first gate insulating film 103 is relaxed by a quantity corresponding to the offset. Therefore, the avalanche breakdown will not easily take place. Furthermore, as for the avalanche breakdown which will be taken place at the interface between the drain joining surface and the second gate insulating film, a storage layer is formed at the interface between the interface of the second gate insulating film 105 and the channel region to prevent the storage of minority carriers which are present in the vicinity of the drain joining end and which will cause the avalanche breakdown to take place. As a result, the voltage resistance can be improved.

As for the above-described first and second gate insulating films, the thickness of the second gate insulating film is defined as follows in a case where interface of the first gate insulating film becomes the main channel region:

$$V+h(1)<V+h(2)<VDD$$

where $$V+h(2)=\theta d(2)/Cox(2)+2\phi B+\phi ms-\theta ss/Cox(2)$$

$V+h(1)$: threshold voltage in a case where the first gate electrode is made to be the main gate $V+h(2)$: threshold voltage in a case where the second gate electrode is made to be the main gate $Cox(2)$: capacity of the second gate insulating film $\phi B$: Fermi potential $\phi ms$: work function difference $\theta d(2)$: charge in the inversion layer induced by the interface of the second gate insulating film $VDD$: power Supply voltage The quantity of the offset is the distance from the source and the drain end of the main gate electrode and it is effective if it is zero or more. However, if the quantity of the offset is too large, gm of the transistor is undesirably reduced. Therefore, setting may usually be made such that LOFFSET$\leq$5 $\mu$m, preferably LOFFSET$\leq$3 $\mu$m.

The transistor according to the present invention is formed into an offset structure, the overall incidental capacitance between the gate and the drain is further reduced at the time of the operation, and the operational frequency can be raised in comparison to the case in which no offset is made.

On the other hand, when the transistor is not operated, the electric field at the interface between the drain joining surface and the base insulating film 103 is relaxed by a quantity corresponding to the offset. Therefore, the avalanche breakdown will not easily take place.

In a case where low-resistance polycrystal silicon or low-resistance amorphous silicon or the like is used as the material for the mask for forming an impurity diffusion layer, either of the above-described layers can be made to serve as the second gate electrode. Therefore, a transistor formed into the double-gate structure can be manufactured. In this case, a channel can be formed at the interface between the upper portion and the lower portion when, for example, the two gates are driven at the same potential at the time of the operation of the transistor. Therefore, apparent gm of the transistor can be doubled.

On the other hand, as for the avalanche breakdown which will be taken place at the interface between the drain joining surface and the upper base insulating film, a storage layer is, at the time of the stoppage of the operation of the transistor, formed at the interface between the interface of the upper base insulating film 105 and the interface of the channel region to prevent the storage of minority carriers which are present in the vicinity of the drain joining end and which will cause the avalanche breakdown to take place. As a result, the voltage resistance can be improved.

A method of manufacturing the above-described transistor will now be described with reference to FIG. 1.

First, the first gate electrode 102 is formed on the transparent insulating substrate 101 made of quartz by an ordinary photolithography process by using metal such as Al, Al—Si, W, or W—Si or the like as the material. Then, the first insulating film 103 made of any one of an SiO film, an SiN film or an SiON film is formed by, for example, the CVD method or the sputtering method. Then, the semiconductor layer 104 is formed on the first insulating film 103. As the semiconductor layer, monocrystalline silicon of a type disclosed by the assignee of the present invention filed in Japanese Patent Laid-Open No. 63-107016 may be used, the monocrystalline silicon being arranged in such a manner that a monocrystalline is grown on an amorphous substrate before the surface of the monocrystal is flattened. As an alternative to this, a material may be used which can be obtained by recrystallizing amorphous silicon film or a polycrystalline silicon film with energy beams or the like for melting the amorphous silicon film or a polycrystalline silicon film.

Then, the second insulating film 105 is formed by the same method as that employed when the first insulating film 103 is formed or by the thermal oxidation method. Then, a second gate electrode material 106 and a photoresist 107 are applied. As the second gate electrode material 106, low-resistance polycrystalline silicon or the low-resistance amorphous silicon prepared by the CVD method may be used. Then, the deposited photoresist or the second gate electrode material is patterned by the ordinary photolithography method. Then, its process will now be described. As shown in FIGS. 1C and 1D, the photoresist 107 is spin-applied before exposure (hv) is performed from the portion including the substrate 101. At the time of the exposure, no individual photomask is not used but the first gate electrode 102 is used as the exposure mask. Then, the photoresist which has been irradiated with light and which has thereby been reacted is developed, while a residual resist pattern 108 is used as the mask to remove the second gate electrode material layer 106 by etching. As a result, a second gate electrode 109 is formed in such a manner that the first gate electrode 102 and the second gate electrode 109 respectively have different widths.

Specifically, the exposure conditions are set so as to make the width of the developed resist pattern 108 larger than the width of the first gate electrode 102 by length L.

Figure 4:
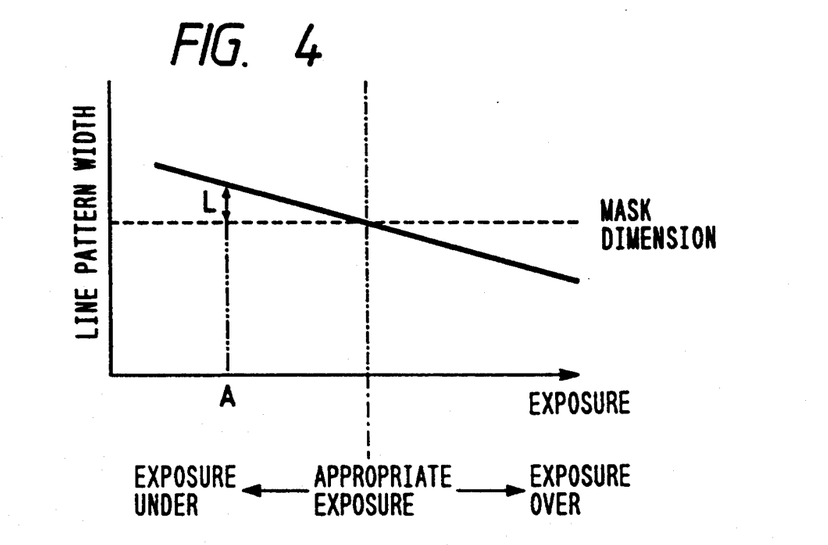
FIG. 4 is a graph which illustrates the relationship between the amount of exposure and the line pattern width arranged at the time of manufacturing the thin film transistor according to the present invention.

The above-described exposure conditions can be set as follows: as shown in FIG. 4, the appropriate exposure quantity is defined to be a quantity with which the mask dimension becomes the same as the resist line dimension in a case where the positive type resist is employed. If the exposure quantity is under the above-described level, the pattern dimension is thickened. If the same is over the above-described level, the pattern dimension is narrowed. Therefore, the exposure may be performed by an exposure quantity with which the actual pattern dimension is thicker than the mask dimension by L. According to actual data obtained by the inventor of the present invention, the line pattern dimension can be enlarged by 0.2 μm by decreasing the exposure quantity from the appropriate exposure quantity by 10%. In a case where a mirror projection apparatus or a stepper is used as the exposure apparatus, the pattern which is thicker by L can be similarly obtained by a method in which the exposure quantity is set to the appropriate exposure quantity and the focal point of projection light is deflected. In actuality, the mirror projection apparatus is used, the line pattern can be thickened by 0.2 μm by performing defocusing by a quantity of 1 μm.

Finally, by using the second gate electrode 109 as the mask, impurities are introduced in order to form the impurity diffusion layer as the source and drain region 110 of the transistor. In this case, a method may be employed in which the photoresist which has been patterned for the purpose of forming the second gate electrode is not removed but the same is left as it is.

According to the method of manufacturing the thin film transistor according to the present invention, the source and drain region 110 serving as the impurity diffusion layer can be formed in a self-aligned manner by the photoresist formed by the backside exposure or by the second gate electrode 109 formed by its photoresist pattern. On the other hand, also the second gate electrode 109 can be formed in the self-aligned manner by the first gate electrode 102. As a result, all of the first and the second gate electrodes and the source and drain regions can be formed in the self-aligned manner. Therefore, the dispersion of the transistor characteristics can satisfactorily be prevented and thereby the yield can be improved.

Then, examples of the present invention will now be described specifically.

EXAMPLE 1

FIGS. 1A to 1F are schematic views which illustrate an example of the process of manufacturing the thin film transistor according to the present invention.

First, tungsten (W) was deposited on the quartz substrate 101 by the sputtering method by a thickness of 2000 Å before the first gate electrode 102 was formed by the ordinary photolithography process. Then, the first gate insulating film ($SiO_2$) 103 was deposited 500 Å thick by the atmospheric CVD method performed under conditions that $SiH_4/O_2$ was used as the reactive gas and the substrate temperature was 400° C. Then, by the reduced-pressure CVD method, an $Si_3N_4$ film was deposited 1000 Å thick before a dot of 1.5 μm × 1.5 μm was left on the first gate electrode 102 by the ordinary photolithography method but the other portions were removed. Then, the crystal was grown by the reduced-pressure CVD method under the following conditions:

$SiH_2Cl_2/HCl/H_2 = 0.53/1.6/100(1/\text{min})$ (150 Torr, 990° C., 120 minutes)

As a result, monocrystalline silicon, the particle size of which was 100 μm, was grown before the surface of it was flattened and smoothed by mechan-o-chemical polishing and etching RIE. As a result, the monocrystalline semiconductor layer 104, the thickness of which was 0.1 μm, was formed before etching RIE was again performed to obtain a desired shape (see FIG. 1A).

Then, the $SiO_2$ film 105 was, by the atmospheric CVD method, deposited 1500 Å under the same conditions as those set when the first gate insulating film 103 was formed. Then, low-resistance polysilicon was, as the second gate electrode material layer 106, deposited 2000 Å thick by the reduced-pressure CVD method. In this case, the deposition conditions were set such that the deposition was performed for 5 minutes while making $SiH_4$ to be 150 sccm, $PH_3$ (diluted by 0.5% $N_2$) to be 15 sccm, the pressure to be 0.2 Torr and the temperature to be 600° C.

The positive type photoresist 107 was applied by the spinning application method and the exposure was made while applying light from the portion including the quartz substrate 101. The exposure quantity was set to a value which was under by 10% from the appropriate exposure quantity (see FIG. 1C). Then, the resist was developed (see FIG. 1D) before the residual resist pattern 108 was used as the mask to subject the second gate electrode material layer 106 to etching RIE so that the second gate electrode 109 was formed. In a case of the above-described exposure conditions, the dimension of the second gate electrode 109 could be made to be a value which was larger by 0.2 μm per side than the dimension of the first gate electrode (see FIG. 1E).

Finally, by the ordinary ion injection method, P+ was injected by IE15cm$^{-2}$ at 140 keV so that the source and drain regions 110 were formed. Furthermore, annealing was performed at 800° C. in order to activate the formed source and drain regions. In accordance with the depth of the SIMS and the result of the line analysis, a fact was confirmed that the source and drain region joining surface was set off by 0.1 μm from the end portion of the first gate electrode 102.

The manufactured transistor was operated, resulting in $10^6$ (A) or more in the on-off ratio, which was a satisfactory practical level to be obtained. The drain rupture voltage resistance when the operation of the transistor was turned off was 15 V or higher which was substantially two times the value of a single gate structure or a structure in which no offset was made.

EXAMPLE 2

Figure 2A:
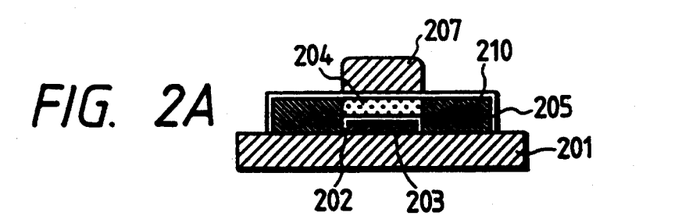
FIGS. 2A to 2C are schematic views which illustrate an example of a process of manufacturing a thin film transistor according to the present invention.
Figure 2B:
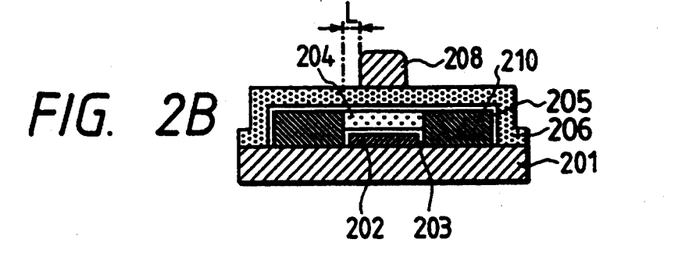
Figure 2C:
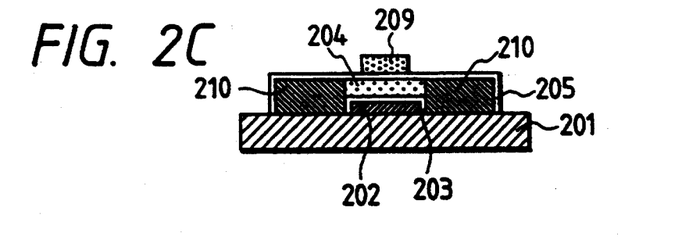

FIGS. 2A to 2C are schematic views which illustrate another example of the process of manufacturing the thin film transistor according to the present invention.

First, tungsten (W) was deposited on the quartz substrate 201 by the sputtering method to a thickness of 2000 Å before the first gate electrode 202 was formed by the ordinary photolithography process. Then, the first gate insulating film (SiO$_2$) 203 was deposited 500 Å thick by the atmospheric CVD method performed under conditions that SiH$_4$/O$_2$ was used as the reactive gas and the substrate temperature was 400° C. Then, by the reduced-pressure CVD method, an Si$_3$N$_4$ film was deposited by 1000 Å before a dot of 1.5 μm × 1.5 μm was left on the first gate electrode 202 by the ordinary photolithography method but the other portions were removed. Then, the crystal was grown by the reduced-pressure CVD method under the following conditions:

$SiH_2Cl_2/HCl/H_2=0.53/1.6/100(1/min)$ (150 Torr, 990° C., 120 minutes)

As a result, monocrystalline silicon, the particle size of which was 100 μm, was grown before the surface of it was flattened and smoothed by mechan-o-chemical polishing and etching RIE. As a result, the monocrystalline semiconductor layer 204, the thickness of which was 0.1 μm, was formed before etching RIE was again performed to obtain a desired shape.

Then, the SiO$_2$ film 205 was, by the atmospheric CVD method, deposited 1500 Å thick under the same conditions as those set when the first gate insulating film 203 was formed.

The positive type photoresist 207 was applied by the spinning application method and the exposure was made while applying light from the portion including the quartz substrate 201. The exposure quantity was set to the appropriate value in this case. Then, the resist was developed before the residual resist pattern 207 was used as the mask to form the source and drain regions 210 by the ordinary ion injection method in which P+ was injected by IE15 cm$^{-2}$ at 140 keV (see FIG. 2A). Furthermore, annealing was performed at 800° C. in order to activate the formed source and drain regions.

Then, low-resistance polysilicon was, as the second gate electrode material layer 206, deposited 2000 Å thick by the reduced-pressure CVD method. In this case, the deposition conditions were set such that the deposition was performed for 5 minutes while making SiH$_4$ to be 150 sccm, PH$_3$ (diluted by 0.5% N$_2$) to be 15 sccm, the pressure to be 0.2 Torr and the temperature to be 600° C.

The positive type photoresist 208 was applied by the spinning application method and the exposure was made while applying light from the portion including the quartz substrate 201. The exposure quantity was set to a value which was under by 10% from the appropriate exposure quantity (see FIG. 2B). Then, the resist was developed before the residual resist pattern 208 was used as the mask to subject the second gate electrode material layer 206 to etching RIE so that the second gate electrode 209 was formed. In a case of the above-described exposure conditions, the dimension of the second gate electrode 209 could be made to be a value which was larger by 0.2 μm per side than the dimension of the first gate electrode (see FIG. 2C).

EXAMPLE 3

Figure 3A:
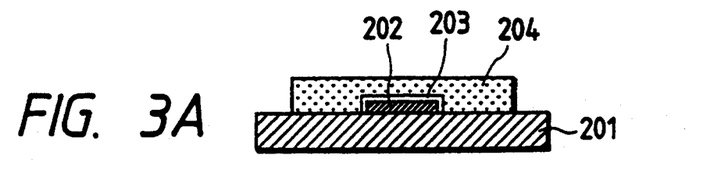
FIGS. 3A to 3C are schematic views which illustrate another example of a process of manufacturing a thin film transistor according to the present invention.
Figure 3B:
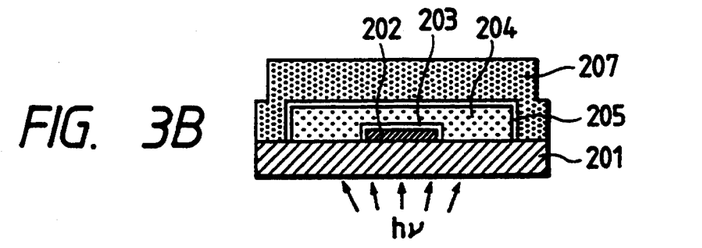
Figure 3C:
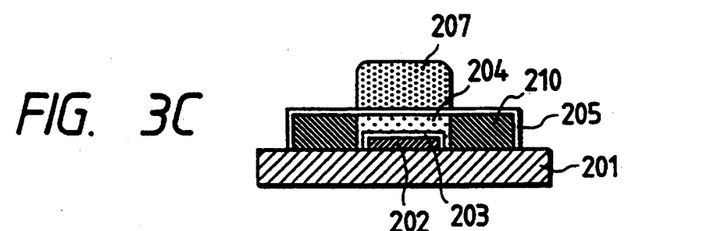

Example 3 will now be described with reference to FIGS. 3A to 3C.

First, tungsten (W) was deposited on the quartz substrate 201 by the sputtering method by a thickness of 2000 Å before the gate electrode 202 was formed by the ordinary photolithography process. Then, the gate insulating film (SiO$_2$) 203 was deposited by 500 Å thick by the atmospheric CVD method performed under conditions that SiH$_4$/O$_2$ was used as the reactive gas and the substrate temperature was 400° C. Then, by the reduced-pressure CVD method, an Si$_3$N$_4$ film was deposited 1000 Å thick before a dot of 1.5 μm × 1.5 μm was left on the gate electrode 202 by the ordinary photolithography method but the other portions were removed. Then, the crystal was grown by the reduced-pressure CVD method under the following conditions:

$SiH_2Cl_2/HCl/H_2=0.53/1.6/100(1/min)$ (150 Torr, 990°C., 120 minutes)

As a result, monocrystalline silicon, the particle size of which was 100 μm, was grown before the surface of it was flattened and smoothed by mechan-o-chemical polishing and etching RIE. As a result, the monocrystalline semiconductor layer 204, the thickness of which was 0.1 μm, was formed before etching RIE was again performed to obtain a desired shape.

Then, the SiO$_2$ film 205 was, by the atmospheric CVD method, deposited 1500 Å thick under the same conditions as those set when the gate insulating film 203 was formed.

The positive type photoresist 207 was applied by the spinning application method and the exposure was made while applying light from the portion including the quartz substrate 201. The exposure quantity was set to a value which was under by 10% from the appropriate exposure quantity (see FIG. 3B). Then, the resist was developed (see FIG. 3C) before the residual resist pattern 207 was used as the mask to form the source and drain region 210 (see FIG. 3A) by the ordinary ion injection method in which P+ was injected by IE15cm$^{-2}$ at 140 keV. Furthermore, annealing was performed at 800° C. in order to activate the formed source and drain regions. In accordance with the depth of the SIMS and the result of the line analysis, a fact were confirmed that the source and drain region joining surface was set off by 0.1 μm from the end portion of the first gate electrode 202.

The manufactured transistor was operated, resulting in 10$^6$ (A) or more in the on-off ratio which was a satisfactory practical level to be obtained. The drain rupture voltage resistance when the operation of the transistor was turned off was 15 V or higher which was substantially two times the value of a single gate structure or a structure in which no offset was made.

Furthermore, the offset structure can be formed by only a single photolithography operation (the necessity of using the mask can be eliminated). In addition, the self-aligned structure with the gate electrode can be formed. As a result, the manufacturing process can be simplified and as well as the characteristics dispersion can be prevented.

As described above, since the SOI-type thin film transistor according to the present invention enables the incidental capacitance between the gate and the drain to be further reduced and thereby enables the operational speed to be raised, the drain rupture voltage resistance at the time when the transistor is turned off can be enlarged. Furthermore, since the two gate electrodes, which are vertically disposed, and the source and drain regions are formed in a self-alignment manner, the undesirable dispersion of the characteristics can be prevented and thereby the yield can be improved.

Although the n-channel MOSFET was used as the MOSFET, a similar effect can, of course, be obtained even if the polarity is inverted.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A method of manufacturing a double gate structure SOI-type thin film transistor, comprising the steps of:
    (a) forming a first gate electrode on one surface of a transparent substrate;
    (b) forming a first gate insulating layer covering the first gate electrode;
    (c) forming a semiconductor layer covering the first gate insulating layer on the substrate;
    (d) forming a second gate insulating layer covering the semiconductor layer;
    (e) depositing a positive photoresist on the second gate insulating layer;
    (f) irradiating light selectively onto the photoresist from another surface of the transparent substrate through the substrate and the first gate electrode using the first gate electrode as a photomask, and subjecting the photoresist to a patterning process;
    (g) injecting an ion into the semiconductor layer using the patterned photoresist as a mask, to form a source or a drain region in the semiconductor layer;
    (h) removing the patterned photoresist;
    (i) forming a conductive layer on the second gate insulating layer;
    (j) depositing a positive photoresist on the conductive layer;
    (k) irradiating light selectively onto the photoresist from the other surface of the transparent substrate through the substrate and the first electrode using the first electrode as a photomask; and
    (l) patterning the photoresist, and etching the conductive layer using the patterned photoresist as the mask to form a second electrode.

2. A method according to claim 1, wherein, in said irradiating step (f), the photoresist is overexposed, to reduce an area of the photoresist pattern for forming the second gate electrode pattern.

3. A method according to claim 1, wherein the first gate electrode is formed from tungsten.

4. A method according to claim 1, wherein the semiconductor layer is formed from silicon.

5. A method according to claim 1, wherein the transparent substrate is formed from a quartz.

6. A method according to claim 1, wherein the positive photoresist is deposited by a spin coat process.

7. A method according to claim 1, wherein the first gate insulator is formed from $Si_3N_4$.

8. A method according to claim 1, wherein the second gate electrode is formed from poly-silicon.

9. A method according to claim 4, wherein the silicon is formed by low-pressure CVD.

10. A method according to claim 4, wherein the silicon is polished mechanically and etched by RIE.

* * * * *

UNITED STATES PATENT AND TRADEMARK OFFICE
CERTIFICATE OF CORRECTION

PATENT NO. : 5,420,048
DATED : May 30, 1995
INVENTOR(S) : SHIGEKI KONDO

It is certified that error appears in the above-identified patent and that said Letters Patent is hereby corrected as shown below:

ON TITLE PAGE

In [56] References Cited, under OTHER PUBLICATIONS:
"5 non" should read --5 nm--.

COLUMN 1

Line 42, "the" (second occurrence) should read --a--.

COLUMN 3

Line 8, "cross sectional" should read --cross-sectional--.
Line 35, "film" should read --film 103--.

COLUMN 5

Line 14, "monocrystalline" should read --monocrystal--.
Line 27, "the" (first occurrence) should be deleted.

COLUMN 6

Line 33, "20007A" should read --2000 Å--.
Line 57, "1500 Å" should read --1500 Å thick--.

COLUMN 7

Line 38, "Åthick" should read --Å thick--.
Line 42, "by 1000 Å" should read --1000 Å thick--.

COLUMN 8

Line 10, "SiH4" should read --$SiH_4$--.
Line 35, "by" (first occurrence) should be deleted.

UNITED STATES PATENT AND TRADEMARK OFFICE
CERTIFICATE OF CORRECTION

PATENT NO.  : 5,420,048
DATED       : May 30, 1995
INVENTOR(S) : SHIGEKI KONDO

It is certified that error appears in the above-identified patent and that said Letters Patent is hereby corrected as shown below:

COLUMN 9

Line 1, "region 210" should read --regions 210--.
    Line 7, "were" should read --was-- and
            "region" should read --regions--.
    Line 8, "was" should read --were--.
    Line 39, "particularly," should read --particularity,--.

Signed and Sealed this

Tenth Day of October, 1995

Attest:

BRUCE LEHMAN

*Attesting Officer*      *Commissioner of Patents and Trademarks*